(12) United States Patent
Pan

(10) Patent No.: US 9,802,536 B2
(45) Date of Patent: Oct. 31, 2017

(54) ACOUSTIC FEEDBACK SYSTEM

(71) Applicant: BOSE CORPORATION, Framingham, MA (US)

(72) Inventor: Davis Pan, Arlington, MA (US)

(73) Assignee: BOSE CORPORATION, Framingham, MA (US)

( * ) Notice: Subject to any disclaimer, the term of this patent is extended or adjusted under 35 U.S.C. 154(b) by 0 days.

(21) Appl. No.: 15/087,975

(22) Filed: Mar. 31, 2016

(65) Prior Publication Data
US 2017/0282790 A1    Oct. 5, 2017

(51) Int. Cl.
*B60Q 1/00* (2006.01)
*B60Q 5/00* (2006.01)

(52) U.S. Cl.
CPC ..................................... *B60Q 5/00* (2013.01)

(58) Field of Classification Search
CPC ........ B60Q 5/00; B60Q 1/00; H04R 2499/13; B60R 25/10
USPC ........ 340/425.5, 438, 426.26, 566; 367/199; 361/86, 122
See application file for complete search history.

(56) References Cited

U.S. PATENT DOCUMENTS

| | | | |
|---|---|---|---|
| 5,335,176 A | 8/1994 | Nakamura | |
| 6,130,608 A | 10/2000 | McKeown et al. | |
| 7,427,929 B2 | 9/2008 | Bauer et al. | |
| 8,285,344 B2 * | 10/2012 | Kahn | H03G 3/32 361/56 |
| 8,319,620 B2 * | 11/2012 | Usher | G08G 1/0965 340/425.5 |
| 8,390,475 B2 | 3/2013 | Feroldi | |
| 2002/0150262 A1 * | 10/2002 | Carter | G08G 1/0962 381/86 |
| 2005/0074131 A1 * | 4/2005 | McCall | H04R 5/02 381/86 |
| 2006/0094331 A1 | 5/2006 | Feldmeier | |
| 2012/0146809 A1 | 6/2012 | Oh et al. | |

* cited by examiner

*Primary Examiner* — Toan N Pham
(74) *Attorney, Agent, or Firm* — Patterson + Sheridan, LLP

(57) ABSTRACT

An acoustic feedback system includes a memory and processor to receive at least one of a plurality of output signals from a plurality of sensors. The system determines whether an output signal has reached a first threshold, and sends an audible sound signal to a speaker(s) based on the first threshold. Thus, the acoustic feedback system utilizes output signals of various vehicle sensors and generates audible signals based on the sensor output signals.

20 Claims, 6 Drawing Sheets

ACOUSTIC FEEDBACK SYSTEM

I. FIELD OF THE DISCLOSURE

The present disclosure relates in general to an acoustic feedback system, such as an on-board vehicle acoustic feedback system to relay output signals of a sensor to an on-board computer or driver.

II. BACKGROUND

Various types of sensors are installed in a vehicle to assess performance and safety conditions. One such sensor interfaces with a graphical display to show gravitational forces (g-forces) incident on the vehicle. However, a graphical display can distract a driver's visual attention, rendering use of the graphical display unsafe or unusable in real-time, especially during high performance driving.

III. SUMMARY

All examples and features mentioned below can be combined in any technically possible way.

In one aspect, an apparatus includes a memory configured to store sound data associated with a plurality of audible sounds. The apparatus further includes a processor configured to receive an output signal from a sensor associated with a vehicle. In some implementations, the processor determines whether the output signal is at a threshold level. The processor is further configured to initiate sending an audible sound signal generated based on the sound data to at least one speaker. In a particular example, the processor initiates sending the audible sound signal based on a determination that the output sound is at the threshold level. The processor is configured to detect an increase in a difference between the output signal and a threshold level. The difference is associated with the output signal being greater than the threshold level. In an illustrative example, the processor identifies an increase (e.g., a continued increase) in the output signal above the first threshold level. In response to detection of the increase, the processor is configured to increase a sound level of the audible sound signal, shift a pitch of the audible sound signal, or modulate the audible sound signal based on another signal. In an illustrative example, the increase in the sound level, change in the pitch, or modulation of the audible sound signal is be based on a difference between the output signal and the threshold. In some implementations, the other signal is as a square wave.

According to a particular implementation, the memory is further configured to store threshold level data of a plurality of threshold levels. The plurality of threshold levels may include the threshold level. The output signal is one of a plurality of output signals received at the processor via a computer bus. The processor is further configured to determine whether the output signal has reached a second threshold level. For example, the processor may determine whether the output signal has reached the second threshold level upon a determination that the output signal has not reached the threshold level. The processor initiates sending of a second audible sound signal generated based on the sound data (e.g., the plurality of audible sounds) to the at least one speaker based on the determination that the output signal has reached the second threshold. In some examples, the audible sound comprises a first type of sound (e.g., a verbal warning), and the second audible sound comprises a second type of sound (e.g., a vehicular sound). In some implementations, the threshold level is greater than the second threshold level. In other implementations, the second threshold level is greater than the threshold level.

According to a particular configuration, the processor is further configured to match the plurality of audible sounds with a plurality of output signals. For example, each audible sound (of the plurality of audible sounds) may correspond to a particular output signal (of the plurality of output signal). To illustrate, a first audible sound may correspond to a first output signal and a second audible sound may correspond to a second output signal. The first output signal and the second output signal may be the same output signal or different output signals. The processor further matches each of a plurality of threshold levels with each of the plurality of audible sounds. For example, the threshold level may correspond to the audible sound signal (associated with a first audible sound) and a second threshold level may correspond to a second audible sound signal (associated with a second audible sound).

In some implementations, the sensor is one of a plurality of sensors, each of the plurality of sensors configured to generate a corresponding output signal. In some implementations including the plurality of sensors, the processor is configured to determine to send the audible sound signal to the at least one speaker based on a spatial relationship between the sensor and the at least one speaker.

According to another implementation, the processor is further configured to modify the threshold level to a second threshold level based on detection of a change in at least one of a plurality of performance margins of a vehicle, such as a vehicle that includes the processor and the memory. The memory is further configured to store information associated with at least one of the change in the at least one of the plurality of performance margins, threshold data associated with the threshold level and the second threshold, or a combination thereof.

In some implementations, the plurality of audible sounds comprises at least one of: a sound of a squealing tire, a sound of a plurality of squealing tires, a sound of a tire losing traction intermittently, a hard braking sound, or a warning sound. Examples of warning sounds include one or more beeps, a siren sound, a verbal warning, etc. In illustrative examples, the plurality of audible sounds differ from each other based on at least one of loudness, pitch, speed, or type of sound.

According to another aspect, a method includes receiving an output signal from a sensor associated with a vehicle. In some implementations, the method further includes determining whether the output signal has reached a threshold level. The method further includes sending a first audible sound signal to at least one speaker. The audible sound signal is based on sound data that may correspond to one or more audible sounds. In particular examples, the audible sound signal corresponds to one of the one or more audible sounds. In some implementations the first audible sound signal is sent to the at least one speaker based on the output signal reaching the threshold level. The method further includes detecting an increase in a difference between the output signal and the threshold level. The difference is associated with the output signal being greater than the threshold level. The method further includes, in response to detecting the increase, increasing a sound level of the first audible sound signal, shifting a pitch of the audible sound signal, or modulating the audible sound signal based on another signal.

According to a particular implementation, the method includes determining whether the output signal has reached a second threshold level. The second threshold is greater than the first threshold. According to the particular implementation, the method further includes, based on the determination that the output signal has reached the second threshold, sending a second audible sound signal generated based on the sound data to the at least one speaker.

In particular examples, the sensor is one of a plurality of sensors configured to generate a plurality of output signals. Additionally, the method further includes determining to send the audible sound signal to the at least one speaker based on an association between the sensor and the at least one speaker.

In illustrative examples, the audible sound signal corresponds to a first type of sound comprising at least one of a sound of a squealing tire and a sound of a tire loosing traction intermittently. The second audible sound has a second type of sound that includes at least one of a hard braking sound or a warning sound. The audible sound signal may be modified based on at least one of: a signal input from the vehicle, a change of a performance of the vehicle, and a response of the vehicle to road condition.

According to another aspect, a computer-readable storage device stores instructions that, when executed by a computer, cause the computer to perform operations comprising receiving at least one of a plurality of output signals from a plurality of sensors associated with a vehicle, and determining whether an output signal of the plurality of output signals has reached a threshold level. The operations further include sending an audible sound signal to at least one speaker based on the output signal reaching the threshold value. In particular examples, the sound data corresponds to one or more audible sounds. The audible sound signal may correspond to a particular one of the one or more audible sounds. The operations further include detecting an increase in a difference between the output signal and a threshold level, the difference associated with the output signal being greater than the threshold level. The operations further include, in response to detecting the increase, increasing a sound level of the audible sound signal, shifting a pitch of the audible sound signal, or modulating the audible sound signal based on another signal.

In a particular implementation, the operations include selecting the at least one speaker based on an association of the at least one speaker with the sensor. In particular examples, the association of the at least one speaker with the sensor comprises at least one of a directional association, a spatial association, and a cognitive association.

Other features, objects, and advantages will become apparent from the following detailed description and drawings.

IV. BRIEF DESCRIPTION OF THE DRAWINGS

V. DETAILED DESCRIPTION

Figure 1:
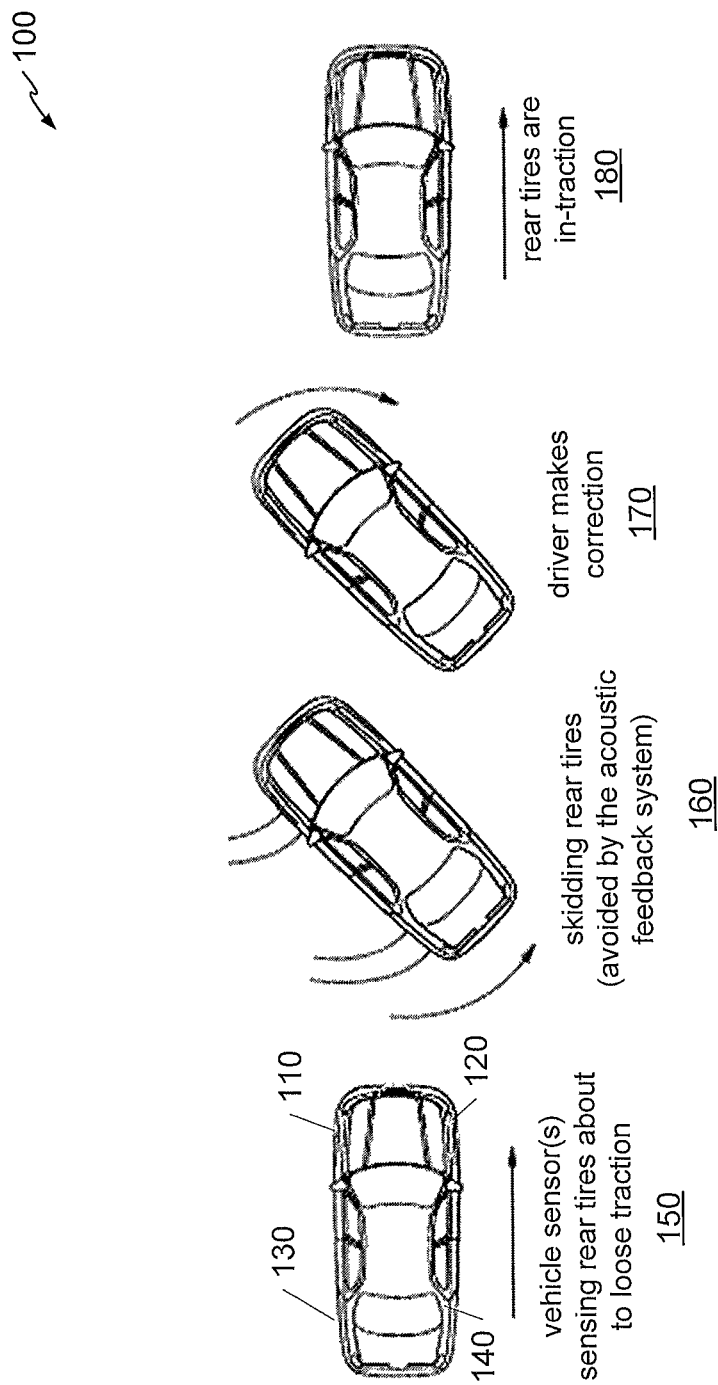
FIG. 1 illustrates an example of an acoustic feedback system used during a car being driven.

An implementation of an acoustic feedback system utilizes output signals of sensors in a vehicle and transforms these output signals into variably-scaled audible sound signals. The signals alert a driver of performance margins of the vehicle or unsafe vehicle or road conditions. The intuitive acoustic conveyance provides real-time, progressive, safe indication of the vehicle's performance margins, condition, or a combination. In particular implementations, in response to an output signal from a sensor satisfying a threshold, an audible sound signal (e.g., a warning indication) is altered in pitch, loudness, or other aspect (e.g., harmonic content). In some examples, the alterations to the audible sound signal are based on an extent that output signal differs from the threshold. For example, as an output signal from a g-force performance sensor decreases, the audible sound signal may be decreased in volume, changed in pitch, or modulated (e.g., because the output signal is falling toward the threshold).

In one example, an acoustic feedback system conveys information related to a sensor data (e.g., from a g-force sensor) in acoustic form by providing a variably-scaled audible sound to a driver of the vehicle. In this manner, the variably-scaled audible sound provides real-time, progressive indications of performance margins available to the vehicle. An example of a variably-scaled audible sound is a sound of a tire squealing as it loses traction on a road. Another example of a variably-scaled audible sound is a simple tone, a sound associated with stickiness (e.g., traction) of a new tire, or a hard braking sound.

In a particular implementation, once a g-force satisfies a first threshold, for example, 80% of a second threshold relative to the performance of the vehicle (e.g., a tire traction limit) or a second threshold independent of the vehicle (e.g., 0.7 g), the system will start playing back a squealing sound. As the g-force continues to increase, the squealing sound gets louder, changes pitch, is changed to a sound of tires losing traction intermittently at friction limits, or any combination thereof. Sound modulated by a square wave produces sound of tires losing traction intermittently at friction limits.

In another instance, additional, higher thresholds are specified. For example, 95% of a traction limit may be preset. Once the car exceeds the additional higher threshold(s), the system plays a different sound to indicate the car is very close to its traction limits. For instance, sound may change from squealing tires to a hard braking sound. With acoustic imaging, multichannel outputs, non-entertainment audio rendering, or any combination, the system conveys individualized acoustic feedback for each of the tires. For example, when a driver-side rear tire is about to lose traction, a driver-side rear speaker(s) provide squealing sound that varies in pitch or changes from squealing tires to a drastic, hard braking sound as thresholds are reached. In another example, different sounds may be played based on the g-force having exceeded different thresholds.

Besides tire performance, the use of various sounds, sound levels, sound playback speed, pitch, or any combination may be used to indicate many other vehicle states. An illustrative state may relate to: fuel efficiency, manual transmission shift points, or safety alerts, among others. Once an antilock brake or traction control system senses a tire slip, maximum, no-slip, g-forces may be calculated to reflect a slippery road surface. The system will recalculate warning thresholds or predetermined thresholds so as to give sonic warning(s) before the tires actually slip.

FIG. 1 depicts an illustration of an implementation of an acoustic feedback system in a vehicle. At 150, one or more sensors of the vehicle detect that rear tires 130, 140 are getting close to losing traction. The output signal may be associated with the approaching traction loss in the left rear tire 130 and right rear tire 140. In another implementation, separate output signals may be associated with the approaching traction loss in the left rear tire 130 and right rear tire 140. The output signal may comprise of a single output signal or a plurality of output signals.

At 160, the rear of the vehicle skids to the right due to loss of traction on its left rear tire 130 and right rear tire 140. At 170, a driver of the vehicle makes correction by turning a steering wheel to the right, slowly braking, or decreasing speed. At 180, the rear tires 130, 140 of the vehicle are now in-traction. A vehicle equipped with the acoustic feedback system enables the driver to avoid the situation illustrated at 160 of FIG. 1. Specifically, when the one or more sensors of vehicle start detecting an impending loss of traction of the rear tires 130, 140, as illustrated at 150, the acoustic feedback system initiates sending an audible sound to one or more speakers based on a determination that an output signal from the one or more sensors is at a threshold level. As a result, the driver makes correction by gently steering to the right, slowly braking, decreasing speed, or any combination thereof, as illustrated at 170. At 180, with the help of the acoustic feedback system, the driver is able to make correction prior to the rear tires 130, 140 loosing traction; thereby, avoiding a dangerous situation.

Figure 2:
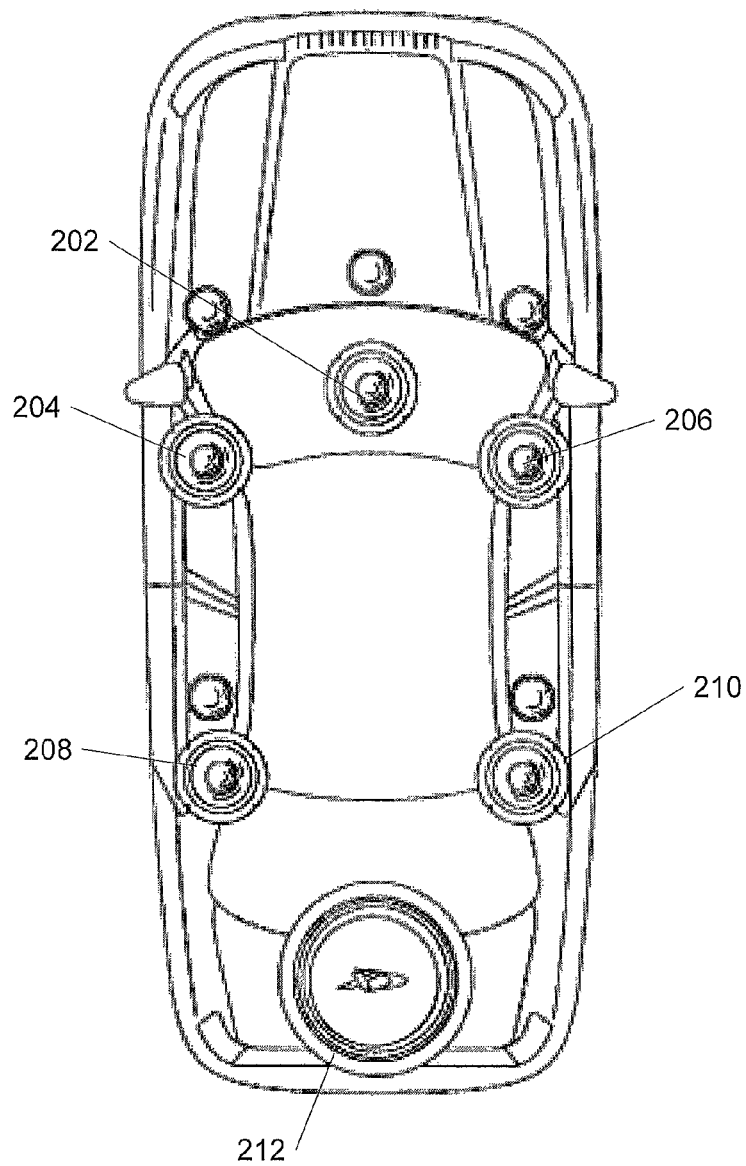
FIG. 2 is an illustrative layout of speakers in a vehicle.

FIG. 2 depicts an illustrative non-limiting layout of speakers in the vehicle depicted in FIG. 1. The vehicle includes a center channel speaker 202, a left front channel speaker 204, a right front channel speaker 206, a left rear surround speaker 208, a right rear surround speaker 210, and a subwoofer 212.

At 150 of FIG. 1, an acoustic feedback system receives at least one output signal from one or more vehicle sensors indicating that the left rear tire 130 and right rear tire 140 are about to lose traction. The output signal may be associated with an impending loss of traction in the left rear tire 130 and right rear tire 140. In another implementation, separate output signals may be associated with the impending loss of traction in the left rear tire 130 and right rear tire 140. The output signal may comprise of a single output signal or a plurality of output signals.

The acoustic feedback system determines whether the output signal has reached at least one threshold. The at least one threshold may be stored in a memory associated with the acoustic feedback system or in a memory associated with the vehicle's on-board system. The at least one threshold may be associated with an industry predetermined threshold(s). In another implementation, the at least one threshold may be associated with thresholds determined by the driver or a user based on a determination of the vehicle's performance margins. The acoustic feedback system sends an audible sound to the left rear surround speaker 208 and the right rear surround speaker 210 based on the at least one threshold. The audible sound may comprise a single audible sound or a plurality of audible sounds.

In another implementation, the vehicle sends a first audible sound to the left rear surround speaker 208 and a second audible sound to the right rear surround speaker 210. The first audible sound and the second audible sound may be different sounds or different type of sounds. The first audible sound may comprise sound of a tire loosing traction intermittently, and the second audible sound may comprise sound of squealing tire. In another implementation, the audible sound comprises sound of a squealing tire, sounds of a plurality of squealing tires, sound of a tire loosing traction intermittently, a hard braking sound, or another warning sound. In another implementation, the acoustic feedback system sends a third audible sound to the left rear surround speaker 208 upon a determination that an impending or actual loss of traction in the left rear tire 130 has at least reached a second threshold.

In another implementation, the acoustic feedback system may send a second audible sound to the right rear surround speaker 210. The second audible sound may be lower in loudness or pitch than the audible sound sent to the left rear surround speaker 208. The acoustic feedback system may also send the second audible sound to the right rear surround speaker 210 upon a determination that an output signal associated with the right rear tire 140 has at least reached a second threshold. A plurality of audible sounds may differ from each other based on at least one of loudness, pitch, speed, or type of sound.

At 170 of FIG. 1, the audible sound sent to the left rear surround speaker 208 and the right rear surround speaker 210 may change. The change may be based on at least one output signal associated with the left rear tire 130, the right rear tire 140, or a combination thereof, reaching a particular threshold. The audible sound comprises sound of a squealing tire, sounds of a plurality of squealing tires, sound of a tire loosing traction intermittently, a hard braking sound, or another warning sound. The plurality of audible sounds differs from each other based on at least one of loudness, pitch, speed, or type of sound. The change in the audio output level, pitch or other sound may be based on an amount the output signal is beyond each threshold. In an implementation, the acoustic feedback system stops sending the audible sound to the at least one speaker when the output signal associated with the at least one speaker falls below the particular threshold.

At 180 of FIG. 1, the left rear tire 130 and the right rear tire 140 are in-traction. The output signal associated with the rear tires 130 and 140 falls below the particular threshold. The acoustic feedback system stops sending the audible sound. In another implementation, the output signal may be associated with other components of the vehicle other than the tires.

An acoustic feedback system that varies sound or type of audible sound or adjusts (scales) loudness/volume, pitch or speed of the audible sound sent to a speaker or a plurality of speakers based on an amount the associated output signal is above a given threshold enables a driver to intuitively react to a change in a vehicle's performance margins or unsafe vehicle or road conditions without having to distract the driver's visual attention. In an implementation, the audible sound sent to a speaker is varied and scaled at the same time.

Figure 3:
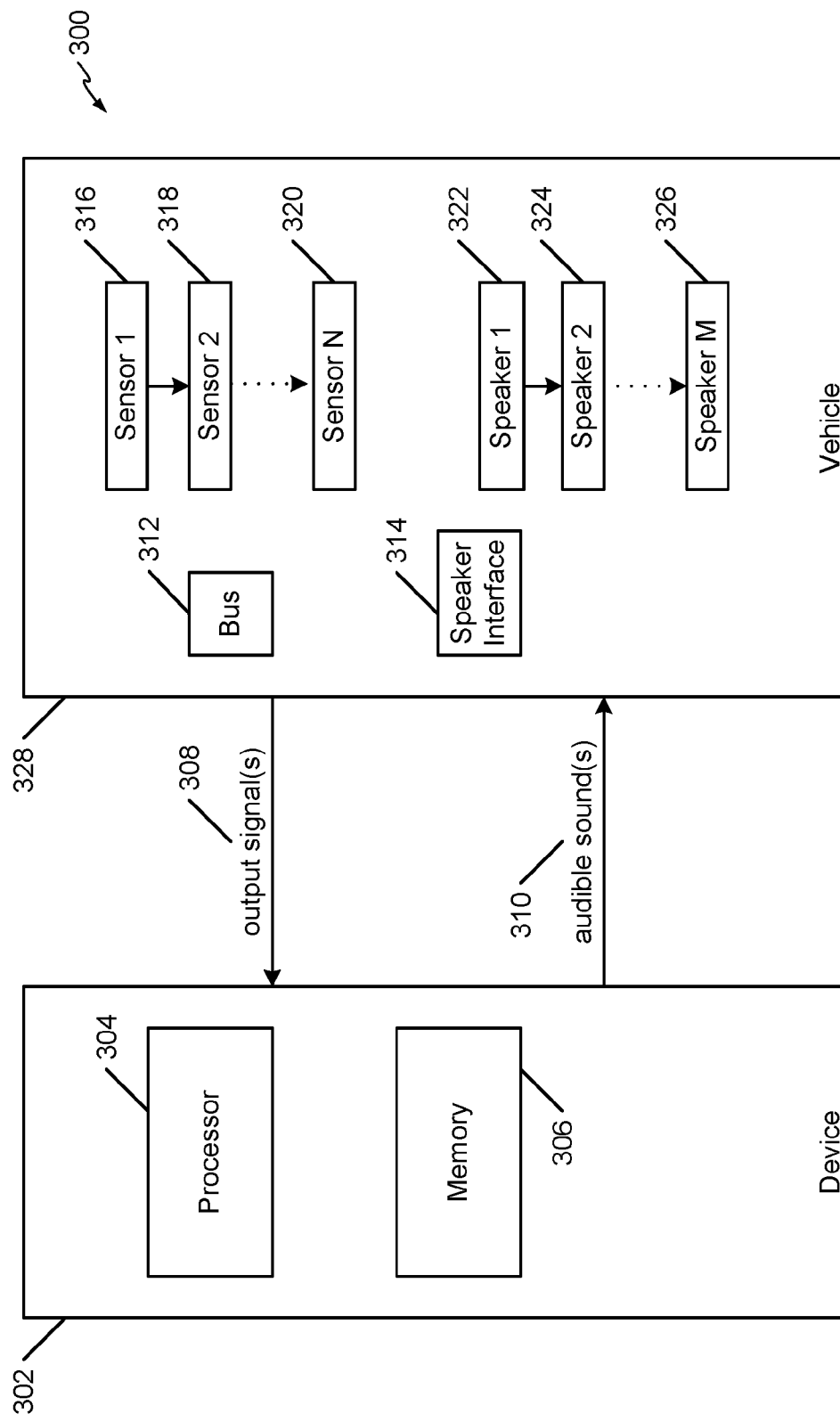
FIG. 3 is a block diagram of an illustrative implementation of an acoustic feedback system.

FIG. 3 is a diagram depicting an illustrative non-limiting implementation of an acoustic feedback system. A device 302 includes a processor 304 and a memory 306. The processor 304 is configured to receive at least one of a plurality of output signals 308 from a plurality of sensors 316-320 associated with a vehicle 328. The processor 304 is further configured to determine whether an output signal 308 of the plurality of output signals 308 has reached at least one threshold. The processor 304 sends an audible sound 310 of the plurality of audible sounds 310 to at least one speaker 322-326 based on the at least one threshold. In another implementation, the processor 304 matches the plurality of audible sounds 310 with the plurality of output signals 308. The processor 304 is configured to match each of a plurality of thresholds with each of the plurality of audible sounds 310. The processor 304 determines a particular sensor of the plurality of sensors 316-320 that generated the output signal 308. The processor 304 further determines at least one speaker 322-326 that is spatially associated with the particular sensor.

The memory 306 of FIG. 3 is configured to store at least one of a plurality of audible sounds 310. In another implementation, the memory 306 is configured to store at least one of a portion of a plurality of thresholds or an entire plurality of thresholds. The memory 306 may also be configured to store at least one of a change in the at least one of the plurality of performance margins, a second threshold, the at least one threshold, or information associated with the change in the at least one of the plurality of performance margins.

The vehicle 328 of FIG. 3 includes a first sensor 316, a second sensor 318, and an Nth sensor 320. The plurality of sensors 316-320 comprise at least one of: a speed/acceleration sensor, a collision sensor, a vehicle distance sensor, an obstacle sensor, a road surface sensor, a wheel rotation sensor, a brake pressure sensor, a tire pressure sensor, an airbag sensor, a suspension adjustment sensor, an exhaust gas sensor, an engine related sensor, an anti-lock brake sensor, a traction control sensor, or a fuel sensor. Further, vehicle 328 includes a plurality of speakers. The plurality of speakers includes a first speaker 322, a second speaker 324, and an Mth speaker 326. For example, the first speaker 322 corresponds to the left rear surround speaker 208 of FIG. 2, and the second speaker 324 corresponds to the right rear surround speaker 210 of FIG. 2.

The device 302 of FIG. 3 receives at least one output signal 308 of the plurality of sensors 316-320 via a bus 312. The bus 312 includes a signal bus, a computer bus, a communication bus, or a vehicle on-board system bus. The device 302 sends at least one of the plurality of audible sounds 310 via a speaker interface 314 or any interfaces available in a vehicle to connect to a plurality of speakers. In an implementation, an acoustic feedback system implemented in the device 302 includes a smartphone, a hand-held device, a portable device, or a vehicle on-board system.

Figure 4:
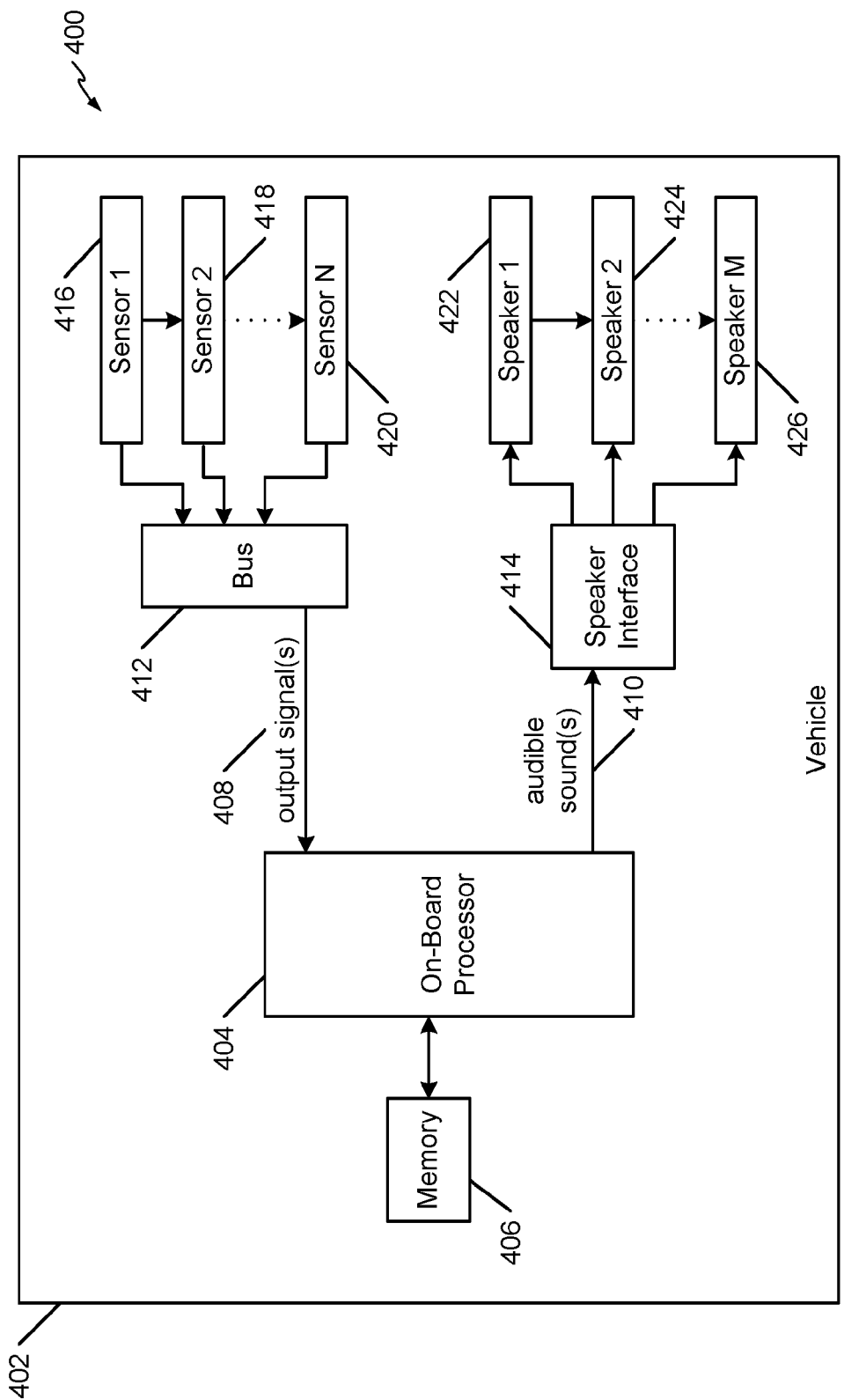
FIG. 4 is a block diagram of an illustrative implementation of an acoustic feedback system using an on-board processor of a vehicle.

FIG. 4 depicts an illustrative, non-limiting implementation of an acoustic feedback system in an on-board system of a vehicle. The processor 304 of FIG. 3 is implemented in an on-board processor 404 of a vehicle 402. The memory 306 of FIG. 3 is implemented in a memory 406 of the vehicle 402. The plurality of sensors 416-420, the plurality of speakers 422-426, the bus 412, and the speaker interface 414 are similar to those illustrated in FIG. 3. The on-board processor 404 of FIG. 4 receives at least one of a plurality of output signals 408 from the plurality of sensors 416-420 associated with the vehicle 402. The on-board processor 404 determines whether an output signal 408 of the plurality of output signals 408 has reached at least one threshold. The on-board processor 404 sends an audible sound 410 of the plurality of audible sounds 410 to at least one speaker 422-426 based on the at least one threshold.

The memory 406 of FIG. 4 stores at least one of a plurality of audible sounds 410. In an implementation, the memory 406 is configured to store at least one of a portion of a plurality of thresholds or an entire plurality of thresholds. The memory 406 may also be configured to store at least one of a change in the at least one of the plurality of performance margins, a second threshold, the at least one threshold, or information associated with the change in the at least one of the plurality of performance margins.

The vehicle 402 of FIG. 4 includes a first sensor 416, a second sensor 418, and an Nth sensor 420. The plurality of sensors 416-420 may comprise at least one of: a speed/acceleration sensor, a collision sensor, a vehicle distance sensor, an obstacle sensor, a road surface sensor, a wheel rotation sensor, a brake pressure sensor, a tire pressure sensor, an airbag sensor, a suspension adjustment sensor, an exhaust gas sensor, an engine related sensor, an anti-lock brake sensor, a traction control sensor, or a fuel sensor. Further, the vehicle 402 includes a plurality of speakers. The plurality of speakers comprises a first speaker 422, a second speaker 424, and an Mth speaker 426. For example, the first speaker 422 corresponds to the left rear surround speaker 208 of FIG. 2 and the second speaker 424 corresponds to the right rear surround speaker 210 of FIG. 2.

Figure 5:
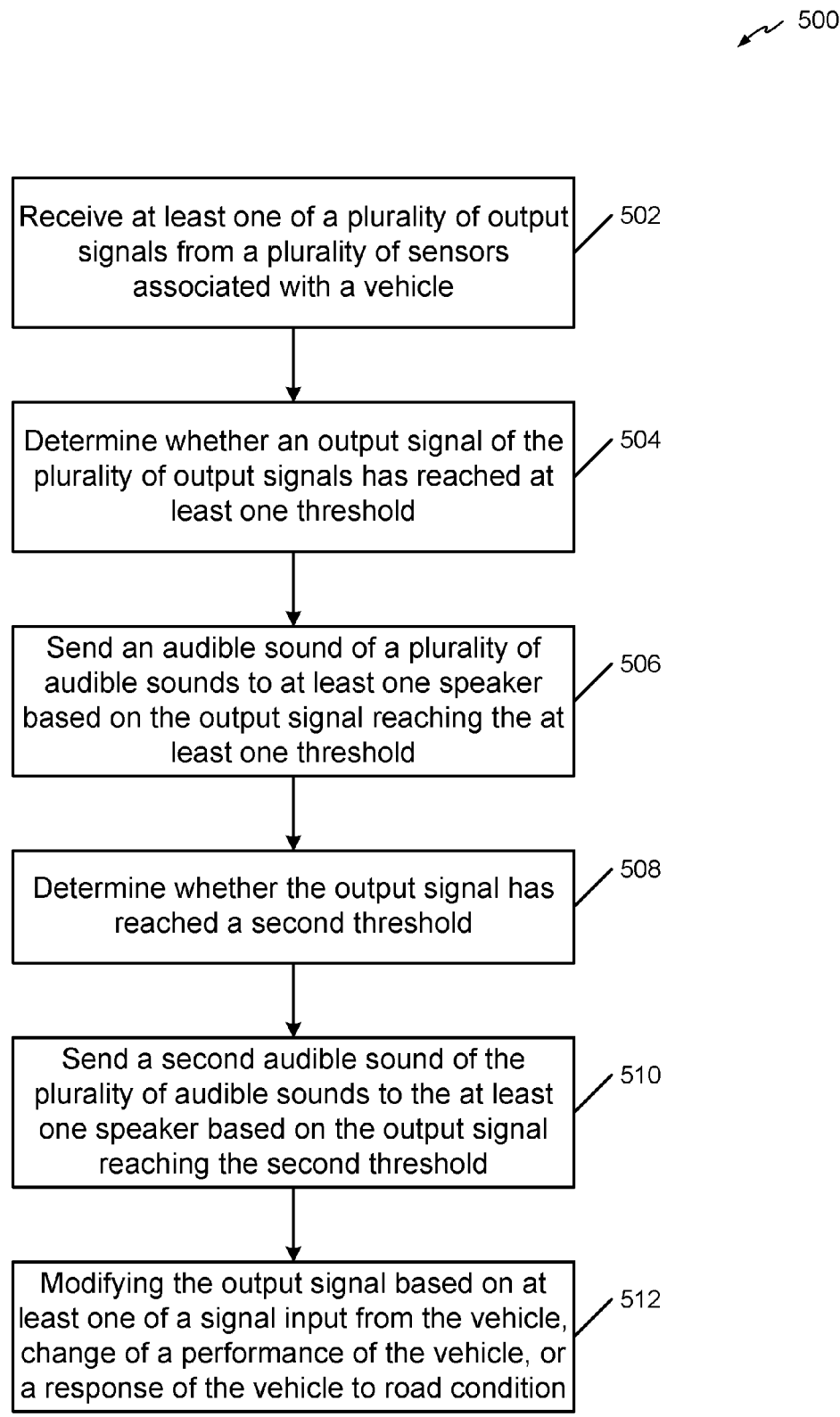
FIG. 5 is a flowchart of an illustrative implementation of a method for implementing an acoustic feedback system.

FIG. 5 depicts a flowchart of an illustrative non-limiting example of a method for implementing an acoustic feedback system. In particular, the method 500 is implemented in the processor 304 of FIG. 3 or the processor 404 of FIG. 4. The method 500 includes, at 502, receiving at least one of a plurality of output signals from a plurality of sensors associated with a vehicle. For example, the plurality of output signals may be the output signal 308 of FIG. 3. The plurality of sensors may be the first sensor 316, the second sensor 318, and the Nth sensor 320 of FIG. 3. The vehicle may be the vehicle 328 of FIG. 3. In another example, the plurality of output signals may be the output signal 408 of FIG. 4. The plurality of sensors may be the sensors 416-420 of FIG. 4. The vehicle may be the vehicle 402 of FIG. 4.

The method 500 includes determining whether an output signal of the plurality of output signals has reached at least one threshold, at 504. For example, the output signal may be the output signal 308 of FIG. 3. In another example, the output signal may be the output signal 408 of FIG. 4. The method 500 also include sending an audible sound of a plurality of audible sounds to at least one speaker based on the output signal reaching the at least one threshold, at 506. For example, the audible sound may be the audible sound 310 of FIG. 3. In another example, the audible sound may be the audible sound 410 of FIG. 4. The at least one speaker may be the speakers 322-326 of FIG. 3. In another example, the at least one speaker includes the speakers 422-426 of FIG. 4. In another instance, the at least one speaker comprises the center channel speaker 202, the left front channel speaker 204, the right front channel speaker 206, the left rear surround speaker 208, the right rear surround speaker 210, or the subwoofer 212 of FIG. 2.

The method 500, at 508, further includes determining whether the output signal has reached a second threshold. For example, at 170 of FIG. 1, an acoustic feedback system determines whether an output signal associated with the left rear tire 130, the right rear tire 140, or a combination thereof, has reached a second threshold. The method 500 includes sending a second audible sound of a plurality of audible sounds to the at least one speaker based on the output signal reaching the second threshold, at 510. For instance, the second audible sound is sent to the left surround speaker 208 of FIG. 2, the right surround speaker 210 of FIG. 2, or a combination thereof. In another example, the second audible sound may be sent to the left front channel speaker 204 if the output signal that reached the second threshold corresponds to a sensor associated with the left front tire 110 of FIG. 1. The sensor associated with the left front tire 110 of FIG. 1 may detect that the left front tire 110 is about to lose traction as the driver makes correction, at 170 of FIG. 1.

The method 500, at 512, includes modifying the output signal based on at least one of a signal input from the vehicle, a change of a performance of the vehicle, or a response of the vehicle to road condition. For example, at 150 or 170 of FIG. 1, an anti-lock brake assist is enabled by the on-board system of the vehicle. The acoustic feedback system may modify the output signal based on the vehicle enabling the anti-lock brake assist. In an implementation, the acoustic feedback system determines whether the modified output signal has reached a third threshold. The acoustic feedback system may send another audible sound to at least one speaker based on the third threshold.

Figure 6:
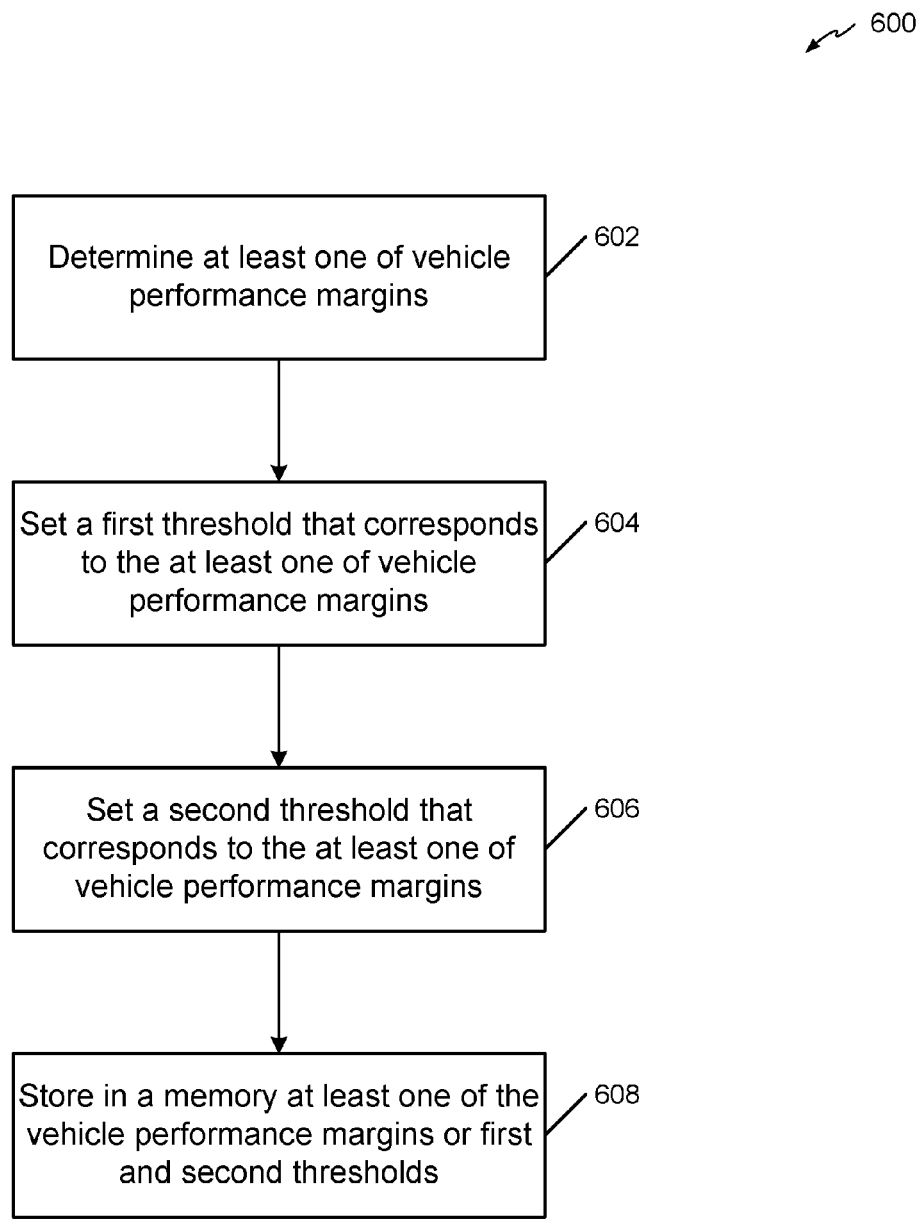
FIG. 6 is a flowchart of an illustrative implementation of a method for determining threshold values of an acoustic feedback system.

FIG. 6 depicts a flowchart of an illustrative non-limiting implementation of a method for determining threshold values of an acoustic feedback system. In particular, the method 600 may be implemented in the processor 304 of FIG. 3 or the processor 404 of FIG. 4. The method 600 includes, at 602, determining at least one vehicle performance margin. As explained herein, the vehicle performance margins are used at 512 of FIG. 5 to modify the output signal. The vehicle performance margins include at least one of: a lateral cornering force, a downforce, a drag, a fuel/air mixture, an acceleration/deceleration speed, and an engine revolution per minute.

The method 600 also includes at 604 setting a first threshold that corresponds to the vehicle performance margin(s). For example, the first threshold may be the threshold at step 504 of FIG. 5. A second threshold that corresponds to the vehicle performance margin(s) is set at 606. For example, the second threshold may be the second threshold at 510 of FIG. 5. At 608, at least one of the vehicle performance margins or the first and second thresholds is stored in a memory. The memory may be the memory 306 of FIG. 3 or the memory 406 of FIG. 4.

In another example, an acoustic feedback system may execute a set, or multiple sets, of instructions to perform one or more computer functions. In particular implementation, the instructions can be embodied in a computer-readable storage device. The computer-readable storage device includes any device that is capable of storing a set of instructions for execution by a processor or that cause a computer system to perform any one or more of the methods or operations disclosed herein. For example, a computer-readable storage device may include random access memory (RAM), flash memory, read-only memory (ROM), programmable read-only memory (PROM), erasable programmable read-only memory (EPROM), electrically erasable programmable read-only memory (EEPROM), registers, a hard disk, a removable disk, a disc-based memory (e.g., compact disc read-only memory (CD-ROM), a solid-state memory, or any other form of storage device. A computer-readable storage device is not a signal.

Those skilled in the art may make numerous uses and modifications of and departures from the specific apparatus and techniques disclosed herein without departing from the inventive concepts. For example, selected implementations of systems in accordance with the present disclosure may include all, fewer, or different components than those described with reference to one or more of the preceding figures. In a specific example, An antilock brake system may have been activated on a slippery surface. The system may have been triggered at a lower value than a previously determined maximum available traction, thus indicating a condition where the traction is lower than previously determined. The acoustic feedback system may modify one of the output signals. For example, the accelerometer reading may be modified so it will trigger the thresholds at lower values. That is, the signal may be scaled up so that the original thresholds, expressed as a percentage of maximum available traction, are still valid. In the above example, if the antilock brakes are triggered at half the maximum, predetermined, available traction limit, then the system will increase the accelerometer reading by a factor of two. The thresholds for accelerometer readings may be 0.5 and 0.8 g's under the optimal traction conditions, where the maximum available traction is 0.9 g's. When the maximum available traction is only 0.45 g's, doubling the accelerometer readings will allow the modified output to be compared against the original thresholds of 0.5 and 0.8 g's. Alternatively, instead of modifying the output signal, the thresholds may be recalculated as a percentage of the newly determined maximum available traction. For example, the previously determined maximum available traction was 0.9 g's and the thresholds may have been set to be 60 and 90 percent of the maximum (0.54 and 0.81 g's respectively). If there is a road condition causing a loss of traction, the maximum available may be 0.5 g's, and the new thresholds would be 0.3 and 0.45 g's. The disclosed implementations should be construed as embracing each and every novel feature and novel combination of features present in or possessed by the apparatus and techniques disclosed herein and limited only by the scope of the appended claims, and equivalents thereof.

The invention claimed is:

1. An apparatus comprising:
   a memory configured to store sound data associated with one or more audible sounds; and
   a processor configured to:
      receive an output signal from a sensor associated with a vehicle;
      initiate sending an audible sound signal generated based on the sound data to at least one speaker;
      detect an increase in a difference between the output signal and a threshold level, the difference associated with the output signal being greater than the threshold level;
      in response to detection of the increase, increase a sound level of the audible sound signal, shift a pitch of the audible sound signal, or modulate the audible sound signal based on another signal; and
      modify the threshold level to a second threshold level based on a detection of a change in at least one of a plurality of performance margins.

2. The apparatus of claim 1, wherein the other signal is a square wave.

3. The apparatus of claim 1, wherein the processor is further configured to:
   determine whether the output signal is at the threshold level, wherein initiation of sending the audible sound signal is responsive to a determination that the output signal is at the threshold level;
   determine whether the output signal has reached the second threshold level; and
   based on the determination that the output signal has reached the second threshold, send a second audible sound signal generated based on the sound data to the at least one speaker.

4. The apparatus of claim 3, wherein the audible sound signal is associated with a first type of sound, and wherein the second audible sound signal is associated with a second type of sound, the second type of sound different from the first type of sound.

5. The apparatus of claim 4, further comprising the at least one speaker configured to provide a first audible sound output associated with the audible sound signal and a second audible sound output associated with the second audible sound signal, wherein a change of sounds between the first audible sound output and the second audible sound output indicates a change in driving conditions.

6. The apparatus of claim 1, wherein each of the one or more audible sounds is associated with at least one corresponding output signal of a plurality of output signals.

7. The apparatus of claim 1, wherein each of a plurality of threshold levels is associated with at least one corresponding audible signal of the one or more audible sounds.

8. The apparatus of claim 1, wherein the sensor is included in a plurality of sensors each of the plurality of sensors configured to generate a corresponding output signal, and wherein the processor is configured to determine to send the audible sound signal to the at least one speaker based on a spatial relationship between the sensor and the at least one speaker.

9. The apparatus of claim 1, wherein the plurality of performance margins are associated with a vehicle that includes the processor and the memory.

10. The apparatus of claim 1, wherein the at least one of the plurality of the performance margins is based on at least one of a plurality of performance sensor outputs, wherein the plurality of performance sensor outputs include the output signal, and wherein a modification of the threshold level to the second threshold level is associated with a change in a road condition, a vehicle operational condition, or other operational condition.

11. The apparatus of claim 1, wherein the memory is further configured to store at least one of information associated with the change in the at least one of the plurality of performance margins or threshold level data associated with the threshold level and the second threshold level.

12. The apparatus of claim 1, wherein the one or more audible sounds comprise at least one of a sound of a squealing tire, a sound of a plurality of squealing tires, a sound of a tire loosing traction intermittently, a hard braking sound, or a warning sound.

13. The apparatus of claim 12, wherein the audible sound signal differs from a second audible sound based on at least one of: loudness, pitch, or speed, and wherein the audible sound signal is generated based on a difference between the output signal and the threshold level.

14. A method comprising:
receiving an output signal from a sensor associated with a vehicle;
sending a first audible sound signal to at least one speaker, the first audible sound based on sound data;
detecting an increase in a difference between the output signal and a threshold level, the difference associated with the output signal being greater than the threshold level;
in response to detecting the increase, increasing a sound level of the first audible sound signal, shifting a pitch of the audible sound signal, or modulating the audible sound signal based on another signal;
determining whether the output signal is at the threshold level, wherein initiation of sending the audible sound signal is responsive to a determining that the output signal is at the threshold level;
determining whether the output signal has reached a second threshold level, the second threshold level greater than the first threshold level; and
based on the determination that the output signal has reached the second threshold, sending a second audible sound signal generated based on the sound data to the at least one speaker.

15. The method of claim 14, wherein the sensor is one of a plurality of sensors configured to generate a plurality of output signals, further comprising determining to send the audible sound signal to the at least one speaker based on an association between the sensor and the at least one speaker.

16. The method of claim 14, further comprising modifying the audible sound signal based on at least one of: a signal input from the vehicle, a change of a performance of the vehicle, and a response of the vehicle to road condition.

17. A computer-readable storage device storing instructions that, when executed by a computer, cause the computer to perform operations comprising:
receiving an output signal from a sensor associated with a vehicle;
sending an audible sound signal to at least one speaker, the audible sound signal based on sound data;
detecting an increase in a difference between the output signal and a threshold level, the difference associated with the output signal being greater than the threshold level; and
in response to detecting the increase, increasing a sound level of the audible sound signal, shifting a pitch of the audible sound signal, or modulating the audible sound signal based on another signal; and
modifying the threshold level to a second threshold level based on a detection of a change in at least one of a plurality of performance margins.

18. The computer-readable storage device of claim 17, further comprising selecting the at least one speaker based on an association of the at least one speaker with the sensor.

19. The computer-readable storage device of claim 18, wherein the association of the at least one speaker with the sensor comprises at least one of a directional association, a spatial association, and a cognitive association.

20. The computer-readable storage device of claim 18, wherein the at least one of the plurality of the performance margins is based on at least one of a plurality of performance sensor outputs, wherein the plurality of performance sensor outputs include the output signal, and wherein a modification of the threshold level to the second threshold level is associated with a change in a road condition, a vehicle operational condition, or other operational condition.

* * * * *